United States Patent
Lee et al.

(10) Patent No.: US 7,332,386 B2
(45) Date of Patent: Feb. 19, 2008

(54) METHODS OF FABRICATING FIN FIELD TRANSISTORS

(75) Inventors: Chul Lee, Seoul (KR); Min-Sang Kim, Seoul (KR); Dong-gun Park, Gyeonggi-do (KR); Choong-ho Lee, Gyeonggi-do (KR); Chang-woo Oh, Gyeonggi-do (KR); Jae-man Yoon, Seoul (KR); Dong-won Kim, Gyeonggi-do (KR); Jeong-dong Choe, Gyeonggi-do (KR); Ming Li, Gyeonggi-do (KR); Hye-jin Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 290 days.

(21) Appl. No.: 11/084,922

(22) Filed: Mar. 21, 2005

(65) Prior Publication Data

US 2005/0269629 A1    Dec. 8, 2005

(30) Foreign Application Priority Data

Mar. 23, 2004   (KR) ............... 10-2004-0019711
Sep. 8, 2004    (KR) ............... 10-2004-0071798

(51) Int. Cl.
*H01L 21/336*   (2006.01)
*H01L 21/8234*  (2006.01)
*H01L 21/8238*  (2006.01)

(52) U.S. Cl. ............ 438/197; 438/212; 257/E21.442; 257/E21.221

(58) Field of Classification Search ................ 438/197, 438/283, 164, 142, 157, 212; 257/E21.442, 257/E21.444, E21.221, E21.223
See application file for complete search history.

(56) References Cited

U.S. PATENT DOCUMENTS 6,635,923 B2 * 10/2003 Hanafi et al. ............... 257/327
2002/0177263 A1   11/2002 Hanafi et al. ............... 438/183
2004/0110331 A1 *  6/2004 Yeo et al. .................... 438/199

\* cited by examiner

*Primary Examiner*—Walter Lindsay, Jr.
(74) *Attorney, Agent, or Firm*—Myers Bigel Sibley & Sibley, P.A.

(57) ABSTRACT

A fin field effect transistor (FinFET) includes a substrate, a fin, a gate electrode, a gate insulation layer, and source and drain regions in the fin. The fin is on and extends laterally along and vertically away from the substrate. The gate electrode covers sides and a top of a portion of the fin. The gate insulation layer is between the gate electrode and the fin. The source region and the drain region in the fin and adjacent to opposite sides of the gate electrode. The source region of the fin has a different width than the drain region of the fin.

16 Claims, 13 Drawing Sheets

METHODS OF FABRICATING FIN FIELD TRANSISTORS

RELATED APPLICATION

This application claims the benefit of and priority to Korean Patent Application No. 10-2004-0019711, filed Mar. 23, 2004, and to Korean Patent Application No. 10-2004-0071798, filed Sep. 8, 2004, the disclosures of which are hereby incorporated herein by reference.

FIELD OF THE INVENTION

The present invention relates to semiconductor devices, and, more particularly, a fin field effect transistor with a vertical channel and related methods of fabricating fin field effect transistors.

BACKGROUND OF THE INVENTION

The continuing trend to fabricate semiconductor devices with smaller device features has led to some difficulties when trying to scale-down transistors that have a horizontal channel (hereinafter referred to as "horizontal channel transistors"). Two difficulties that can arise when trying to scale-down horizontal channel transistors are short channel effect and drain induced barrier lower (DIBL) effect. When a channel length of a transistor is reduced to 50 nanometers or less, the dispersion of device characteristics can become high due to fabrication process variations. When the channel length is 30 nanometers or less, the channel effect and DIBL effect can become so severe that the resulting transistor will operate abnormally.

Various different types of transistors have been developed to overcome some of the limitations associated with fabricating horizontal channel transistors. One such transistor is a double gate transistor. The double gate transistor includes a channel that may have a length of 30 nanometers or less, and a single gate on the channel or two gates on opposite sides of the channel. Because a conventional transistor has a gate electrode formed only over a horizontal channel, an electric field is asymmetrically applied to a top and bottom of the channel to prevent the turning on/off of the transistor from being controlled by the gate electrode.

In contrast, because a double gate electrode has two gate electrodes on opposite sides of a thin channel, an entire area of the channel is affected by the gate electrode. Thus, when the transistor is turned off, charge flow between a source and a drain may be suppressed to reduce power dissipation and to control the turning on-off of the transistor.

A double gate transistor using a damascene gate is disclosed in U.S. Patent Publication No. 2002/0177263 entitled "DAMASCENE DOUBLE-GATE MOSFET WITH VERTICAL CHANNEL REGIONS", issued to Hussein et al.

FIG. 1 is a perspective view of a damascene double gate MOS transistor, such as that disclosed in U.S. Patent Publication No. 2002/0177263. As illustrated in FIG. 1, a transistor 14 includes a silicon layer 10 on an insulator 12 and a gate electrode 28 that extends across the silicon layer 10. A hard mask pattern 18 is on the silicon layer 10, and the gate electrode 28 is on the hard mask pattern 18. A gate insulator 30 is between the gate electrode 28 and a sidewall of the silicon layer 10. A source/drain region 22 is formed in the silicon layer 10 adjacent to opposite sides of the gate electrode 28.

As previously discussed, a double MOS transistor with a vertical channel has a narrow silicon layer in which a channel is formed. The gate may thereby exhibit a high controllability for the channel. Because a typical silicon layer has a width ranging from several nanometers to dozens of nanometers, the transistor is often called a fin field effect transistor (hereinafter referred to as "FinFET") due to its shape. One difficulty in using FinFETs is that threshold voltages can vary considerably depending upon variations in their fabrication processes. Consequently, it can be difficult to control the threshold voltage of the transistor and provide cell uniformity in a high-density memory device.

Lowering of the threshold voltage of a transistor can increase the sub-threshold voltage leakage. Leakage current of a transistor results in degradation of the devices made therefrom. For example, leakage current can result in degradation of the data retention characteristics of a DRAM device. Consequently, it can be important to minimize leakage current of, for example, a source region to which a capacitor is connected. A channel concentration can be raised to increase a threshold voltage of the transistor. However, increased threshold voltage can cause a decrease in the turn-on current of the transistor, and increased channel concentration can cause an increase in junction current. Therefore, when such a transistor is used in a DRAM device, the decreased turn-on current can reduce a write margin, and the increased storage node junction leakage can deteriorate a data retention characteristic of the DRAM device.

SUMMARY OF THE INVENTION

In some embodiments of the present invention, a fin field effect transistor (FinFET) includes a substrate, a fin, a gate electrode, a gate insulation layer, and source and drain regions in the fin. The fin is on and extends laterally along and vertically away from the substrate. The gate electrode covers sides and a top portion of the fin. The gate insulation layer is between the gate electrode and the fin. The source region and the drain region are in the fin and adjacent to opposite sides of the gate electrode. The source region of the fin has a different width than the drain region of the fin.

In some further embodiments of the present invention, the source region of the fin has a smaller width than the drain region of the fin. A portion of the fin under the gate electrode can have an abrupt change in width. The abrupt change in width of the fin under the gate electrode can form sidewalls of the fin that have a T-shape.

In some other embodiments of the present invention, a FinFET includes a substrate, a fin, a gate electrode, source and drain regions in the fin, and a channel region in the fin. The fin is on and extends laterally along and vertically away from the substrate. The gate electrode covers sides and a top portion of the fin. The source region and the drain region in the fin are adjacent to opposite sides of the gate electrode. The drain region of the fin has a greater width than the source region of the fin. The channel region in the fin is between the source region and the drain region. An impurity concentration of the channel region that is adjacent to the drain region is higher than the impurity concentration of the channel region that is adjacent to the source region.

In some further embodiments of the present invention, a portion of the fin under the gate electrode has an abrupt change in width. The abrupt change in width of the fin under the gate electrode can form sidewalls of the fin that have a T-shape. The fin can taper off from the drain region to the source region. The channel region that is adjacent to the source region can have about the same impurity concentration as the substrate, and the channel region that is adjacent to the drain region can have a higher impurity concentration than the substrate.

In some other embodiments of the present invention, a FinFET includes a substrate, a fin, a pair of gate electrodes, a gain insulating layer, a common drain region in the fin, and a pair of source regions in the fin. The fin is on and extends laterally along and vertically away from the substrate. Each of the gate electrodes cover sides and a top of adjacent portions of the fin. The gate insulating layer is between the pair of gate electrodes and the fin. The common drain region in the fin is between the pair of gate electrodes. Each of the source regions is adjacent to a side of a different one of the pair of gate electrodes and opposite to the common drain region. The source regions of the fin have a different width than the common drain region of the fin.

In some further embodiments of the present invention, the source regions of the fin have a smaller width than the common drain region of the fin. A portion of the fin under each of the pair of gate electrodes can have an abrupt change in width. The fin can taper off in width from the common drain region to the source regions.

In some other embodiments of the present invention, a FinFET includes a substrate, a fin, a pair of gate electrodes, a gain insulating layer, a common drain region in the fin, a pair of source regions in the fin, and a channel region in the fin. The fin is on and extends laterally along and vertically away from the substrate. Each of the gate electrodes cover sides and a top of adjacent portions of the fin. The gate insulating layer is between the pair of gate electrodes and the fin. The common drain region in the fin is between the pair of gate electrodes. Each of the source regions is adjacent to a side of a different one of the pair of gate electrodes and opposite to the common drain region. The channel region in the fin is between the common drain region and the source regions. The channel region adjacent to the common drain region has a higher impurity concentration than the channel region adjacent to the source regions.

In some further embodiments of the present invention, the source regions of the fin have a smaller width than the common drain region of the fin. A portion of the fin under each of the pair of gate electrodes can have an abrupt change in width. The fin can taper off in width from the common drain region to the source regions. The channel region that is adjacent to the source region can have about the same impurity concentration as the substrate, and the channel region that is adjacent to the common drain region can have a higher impurity concentration than the substrate.

In some other embodiments of the present invention, a method for fabricating FinFET includes providing a substrate. A fin is formed on the substrate and extends laterally along and vertically away from the substrate. A first region of the fin has a first fin width and a second region of the fin has a second fin width, where the second fin width is larger than the first fin width. A gate insulation layer is formed on a portion of the fin. A gate electrode is formed on the gate insulating layer and covers sides and a top portion of the fin.

In some further embodiments of the present invention, formation of the fin includes patterning the substrate to form the fin with the second fin width therefrom. A mask pattern is formed on the fin. A sidewall of the fin is oxidized to form a sacrificial oxide layer while using the mask pattern as an oxidation barrier layer. The sacrificial oxide layer is removed to form the first region of the fin having the first fin width. The mask pattern is removed to expose the second region of the fin having the second fin width.

In yet some further embodiments of the present invention, providing the substrate includes providing a support substrate and patterning the semiconductor substrate to form the fin therefrom. A buried insulating layer is formed on the support substrate. A semiconductor layer is formed on the buried insulating layer.

In yet some further embodiments of the present invention, the substrate comprises a semiconductor substrate. The semiconductor substrate is patterned to form the fin therefrom. A device isolation layer is formed on the semiconductor substrate and the fin.

In yet some further embodiments of the present invention, formation of the device isolation layer includes forming a liner layer on the semiconductor substrate and the fin, forming an insulation layer on the liner layer, recessing a portion of the insulation layer to expose the liner layer, and recessing the liner layer to partially expose sidewalls of the fin.

In some other embodiments of the present invention, a method for fabricating a FinFET includes providing a substrate. A fin is formed on the substrate and extends laterally along and vertically away from the substrate. A first region of the fin has a first fin width and a second region of the fin has a second fin width, where the second fin width is larger than the first fin width. A gate insulation layer is formed on a portion of the fin. A gate electrode is formed on the gate insulating layer and covers sides and a top portion of the fin. Impurities of a first conduction type are implanted into one side of the gate electrode. Impurities of a second conduction type are implanted into the fin using the gate electrode as an ion implanting mask, and to form a source region in the first region, to form a drain region in the second region, and to form a first diffusion layer in a channel region adjacent to the drain region. The source and drain regions define the channel region.

In some further embodiments of the present invention, the impurities of the second conduction type are implanted into the fin with a shorter lateral diffusion distance than a lateral diffusion distance of the first conduction-type impurities.

DETAILED DESCRIPTION OF EMBODIMENTS OF THE INVENTION

Figure 1:
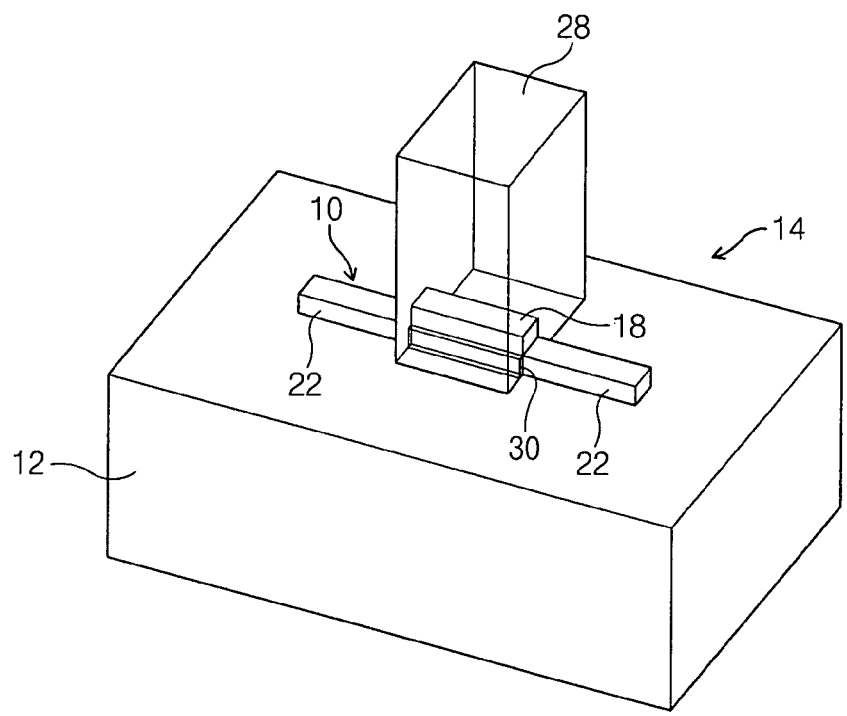
FIG. 1 is a perspective view of a conventional vertical double gate transistor.

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
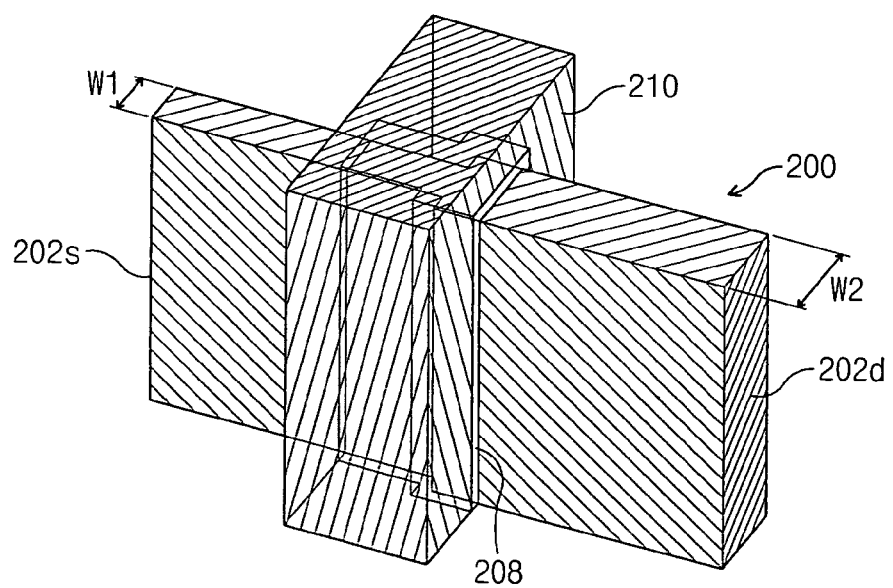
FIG. 2 is a perspective view of a FinFET according to a first embodiment of the present invention.

FIG. 2 is a perspective view of a FinFET in accordance with a first embodiment of the present invention. The FinFET includes a fin 200 that is on a substrate, such as the substrate 12 of FIG. 1, and that extends laterally along the substrate and vertically away from the substrate. Accordingly, fin 200 may be referred to as vertically extending fin 200. The fin 200 includes a first region having a first fin width W1 and a second region having a second fin width W2 that is larger than the first fin width W1. A gate electrode 210 covers sides and a top of a portion of the fin 200. A gate insulation layer 208 is between the gate electrode 210 and the fin 200. A source region 202s and a drain regions 202d are formed in the fin 200 adjacent to opposite sides of the gate electrode 210. The source region 202s is formed in the first region of the fin 200, and the drain region 202d is formed in the second region 202s of the fin 200.

The gate electrode 210 covers a portion of the fin 200 that includes a boundary region between the first and second regions. The portion of the fin 200 that is covered by the gate electrode 210 corresponds to a channel region of the FinFET. The channel region is between the source region 202s and the drain regions 202d. As shown, a portion of the fin 200 under the gate electrode 210 can have an abrupt change in width, and sidewalls of the fin 200 may have a T-shape. Instead of having an abrupt change in width, the fin 200 may taper off from the drain region 202d to the source region 202s.

Figure 3:
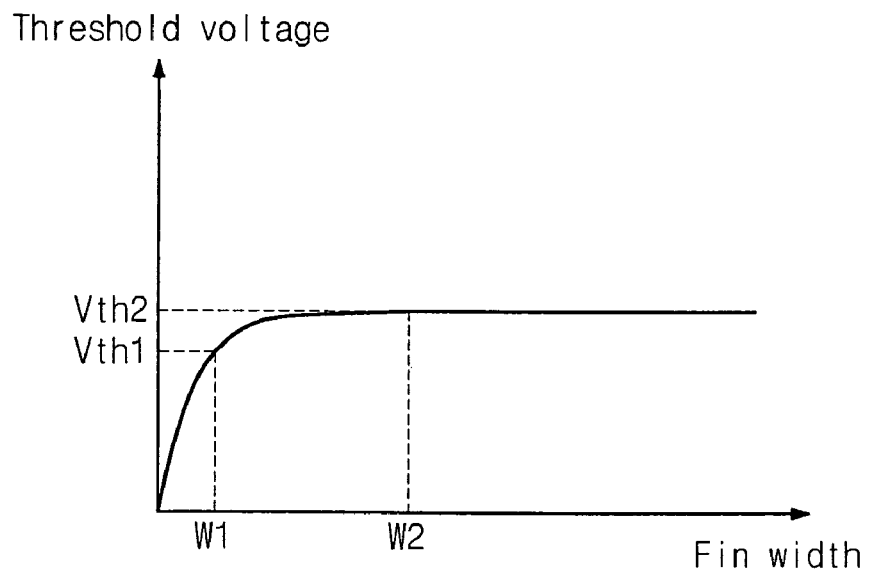
FIG. 3 is a graph that illustrates an exemplary threshold voltage of the FinFET shown in FIG. 2.

FIG. 3 is a graph of an exemplary threshold voltage of the FinFET of FIG. 2 in accordance with some embodiments of the present invention. In the graph, a transversal axis denotes a fin width and a longitudinal axis denotes a threshold voltage. As illustrated in this figure, as the fin width decreases below a determined width, the threshold voltage rapidly decreases. For example, when the fin width is W1, a threshold voltage Vth1 is located where the rate of change (ΔVth/ΔW) is high, and where a small change in the fin width can significantly change the threshold voltage. When the fin width is W2, a threshold voltage Vth2 is located where the rate of change is low, and where a relatively larger change in fin width, such as due to fabrication process variations, does not cause a significant change in the threshold voltage. Accordingly, it can be preferable for a FinFET to have a fin width that is of sufficient width such that small changes in the width do not cause significant changes in the threshold voltage.

A FinFET in accordance with some embodiments of the present invention has two different fin widths, and can include a larger fin width region and a smaller fin width region. A source region can be formed in the small fin width region, which may lower source junction leakage current and suppress occurrences of soft error. Accordingly, the threshold voltage may be made less sensitive to fabrication process variations without increasing the fin width. The FinFET may be used in DRAM devices because the source junction leakage current can be low and the generation of soft errors can be suppressed. A FinFET can operate when the gate overlapped fin inside is fully depleted. As a result, the FinFET can have a much higher current driving efficiency than a typical planar transistor. When the fin that is adjacent to a source is wide and the fin that is adjacent to a drain is narrow, the driven current may be effectively increased with little or no increase in drain current.

Figure 4:
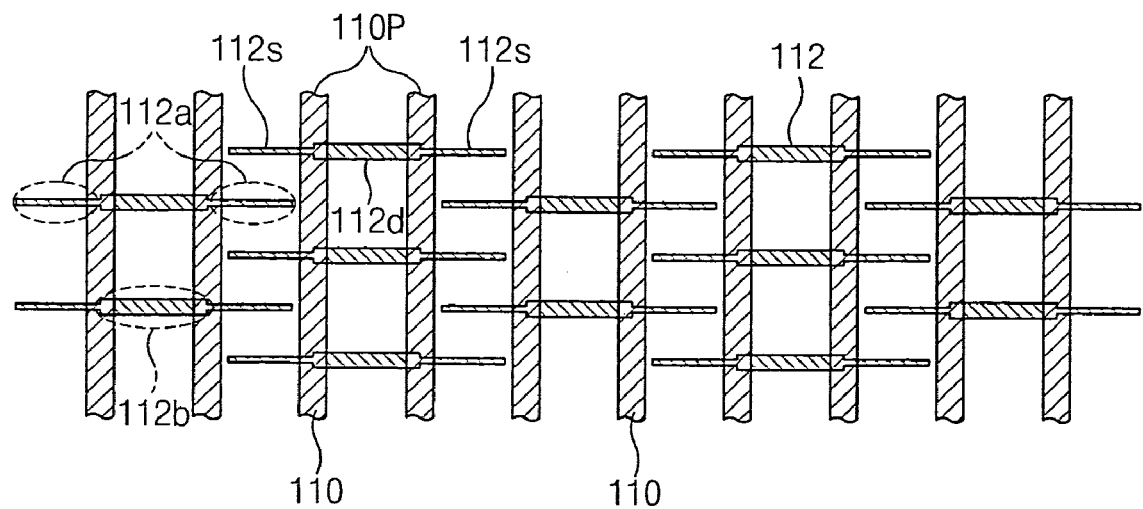
FIG. 4 is a top plan view of a portion of a DRAM cell array with the FinFETs of FIG. 2 in accordance with some embodiments of the present invention.

FIG. 4 is a top plan view showing a portion of a DRAM cell array with the FinFET shown in FIG. 2 in accordance with some embodiments of the present invention.

Referring to FIG. 4, a DRAM cell array includes a plurality of fins 112 that are formed on a substrate. The substrate may be a SOI substrate or a bulk semiconductor substrate. If the substrate is a SOI substrate, the fins are disposed on an insulation layer. If the substrate is a bulk semiconductor substrate, the fins may be formed by etching the bulk semiconductor substrate. The fin 122 includes a first region 112a having a first fin width and a second region 112b having a second fin width. The first region 112a is adjacent to opposite sides of the fin, and the second region 112b is between the first regions 112a. A pair of gate electrodes 10p cross over the respective fins 112, so that each of the gate electrodes 10p cover sides and a top of adjacent portions of the fins 112. Each gate electrode 110 overlaps an upper part of a boundary region of the first region 112a and the second region 112b. Source region 112s are formed in the fins 112 and are adjacent to a side of a different one of the pair of gate electrodes 110 and opposite to a common drain region 112d. The common drain region 112d is formed in the fin 112 between the gate electrodes 110. Although not shown in this figure, a capacitor is connected to the source region 112s and a bitline is connected to the common drain region 112d.

A channel region can be defined in each of the fins 112 between the source region and the source regions 112s and the common drain regions 112d. The channel region can include two channel portions having different threshold voltages. The source region 112s can be formed in the smaller width region of the fins 112, and the drain regions 112d can be formed in the larger width region of the fins 112, which may lower source junction leakage current and suppress the generation of soft errors. Because, the fin width is larger along a portion of a gate electrode 110, a threshold voltage of the FinFETs may be increased which may enhance its controllability and avoid lowering of the drain current.

The FinFETs of FIGS. 2 and 4 may be formed on a SOI substrate or a bulk silicon substrate, and may be formed using a conventional gate process or a damascene gate process, but modified as described herein in accordance with some embodiments of the present invention.

FIGS. 5, 6, 7A, 8A, and 9A illustrate methods of fabricating a DRAM cell array in accordance with the first embodiment of the present invention. FIGS. 7B, 7C, 7D, 8B, and 9B are cross-sectional views that illustrate a method of fabricating the DRAM cell with the FinFETs of FIG. 2 in accordance with some embodiments of the present invention.

Figure 5:
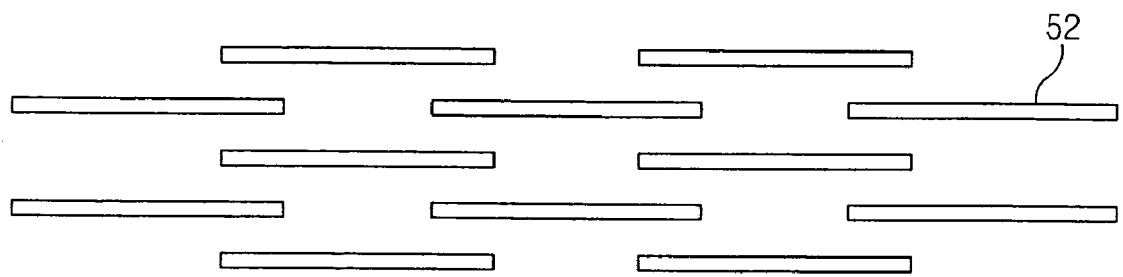
FIGS. 5, 6, 7A, 8A, and 9A are top plan views that illustrate a method of fabricating a DRAM cell array with the FinFETs of FIG. 2 in accordance with some embodiments of the present invention.

Referring to FIG. 5, a substrate is provided, and a plurality of fins 52 are formed on the substrate. The fins 52 are formed on the substrate and extend laterally along and vertically away from the substrate. The substrate may be a SOI substrate or a semiconductor bulk substrate. In case of a SOI substrate, the fins 52 are formed on an insulation layer. In case of a semiconductor bulk substrate, the fins 52 can be on and extend away from the substrate. A semiconductor layer of the SOI substrate or the semiconductor bulk substrate may be formed from silicon, germanium, silicon germanium, germanium silicon germanium and/or combinations thereof.

Figure 6:
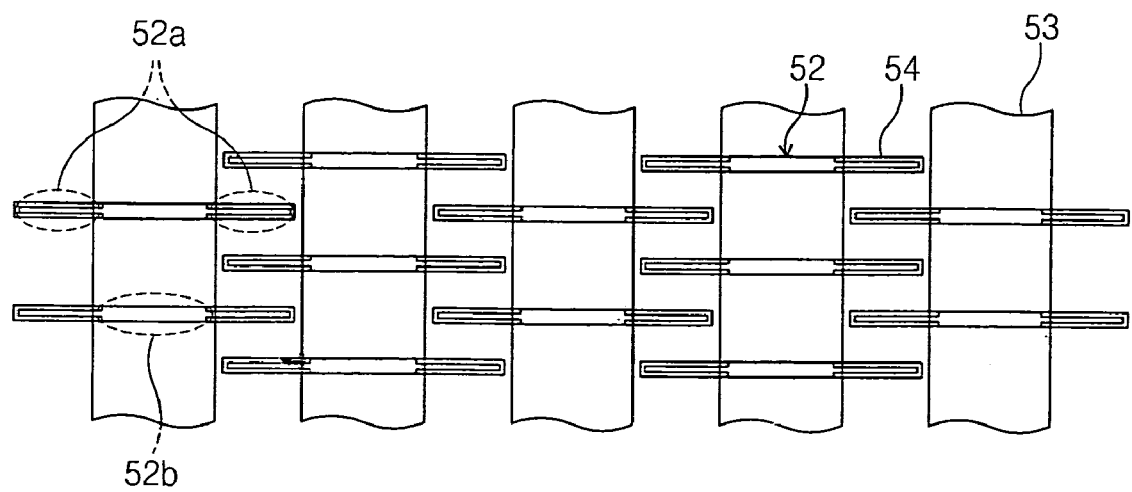

Referring to FIG. 6, a mask pattern 53 is formed on the substrate and crossing over center portions of the fins 52. Using the mask pattern 53 as an oxidation barrier layer, the fin 52 is thermally oxidized to form a sacrificial oxide layer 54 on sidewalls of the fins 52. Through the thermal oxidation, a layer of the exposed portion of the fins 52 is removed so that the width of the exposed portions of the fins 52 is reduced. Thus, a thermal oxidation layer is formed on first regions 52a on both sides of the fins 52, and is not formed on a second region 52b between the first regions 52a. The first region 52a has a first fin width, and the second region 52b has a second fin width that is greater than the first fin width (i.e., the second fin width is the initial fin width of the fins 52).

Figure 7A:
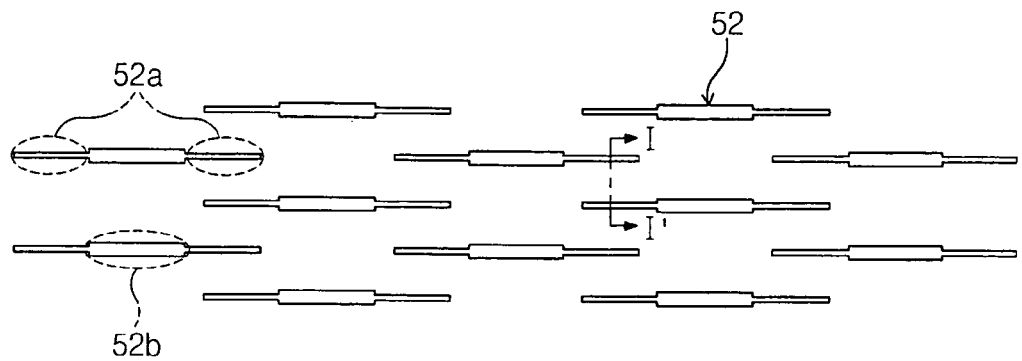

Referring to FIG. 7A, the mask pattern 53 and the sacrificial oxide layer 54 are removed to form a first region 52a at both sides of the fins 52 and to expose the second region 52b between the first regions 52a. The first region 52a has a first fin width, and the second region 52b has a second fin width which larger than the first fin width.

Figure 7B:
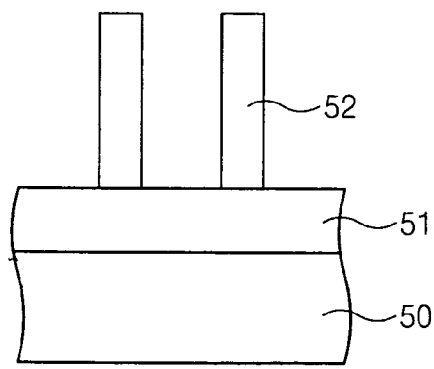
FIGS. 7B, 7C, 7D, 8B, and 9B are cross-sectional views that illustrate a method of fabricating the DRAM cell with the FinFETs of FIG. 2 in accordance with some embodiments of the present invention.
Figure 7C:
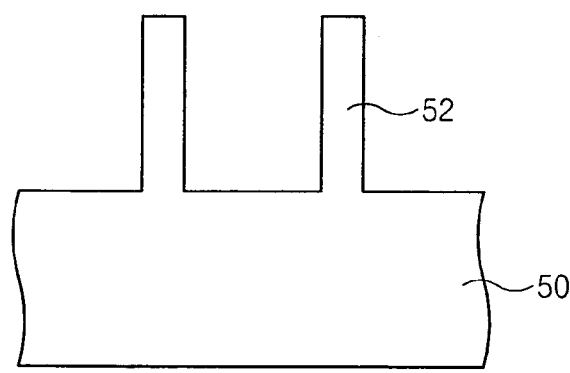

FIG. 7B illustrates a cross-sectional view of fins 52 formed on an SOI substrate. The vertically extending fins 52 are on a buried insulation layer 51, and on a support substrate 50. In FIG. 7B, the fins 52 are formed on a bulk substrate and extend vertically away from the substrate.

Figure 7D:
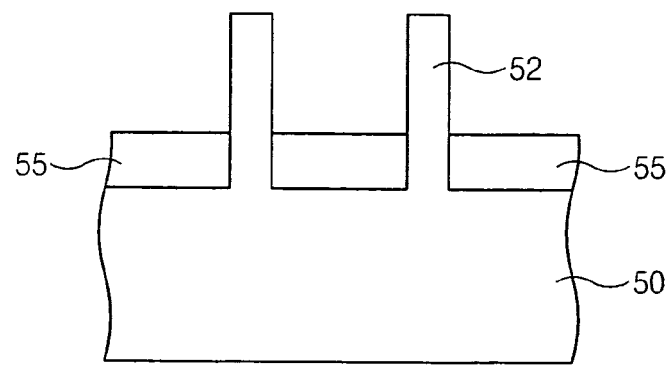

When the fins 52 are formed on an SOI substrate, the fins 52 are formed on an insulation layer 51 that is isolated from the substrate. When the fins 52 are formed over a bulk substrate, the fins 52 are interconnected to the substrate. Thus, when a FinFET is formed using a bulk substrate, a device isolation layer 55 is formed between the fins 52 to isolate the fins 52 from one another, as illustrated in FIG. 7D. Although not shown in the figures, a conventional gate process or a damascene gate process may be applied to form a gate electrode on and crossing over the fins 52.

Some other methods for isolating fins that are formed on a bulk substrate will now be described hereinafter.

Figure 8A:
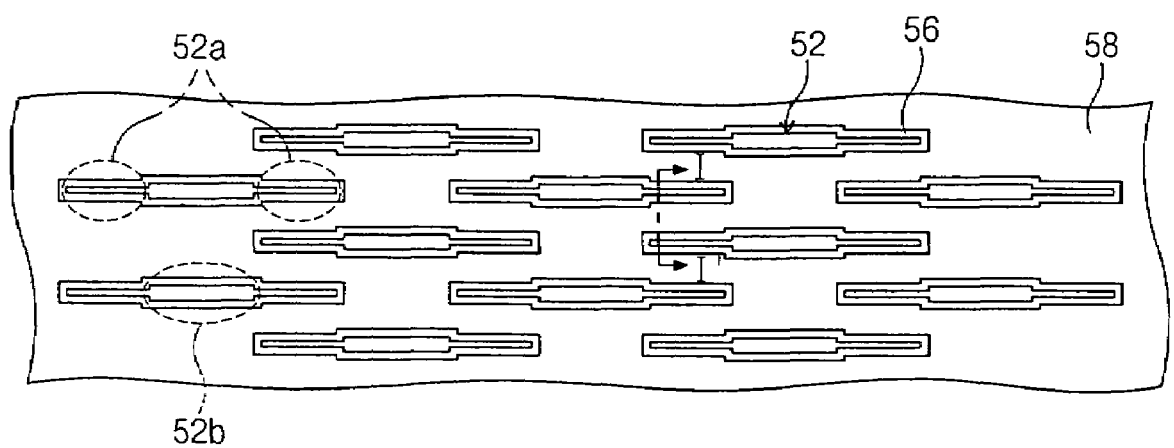
Figure 8B:
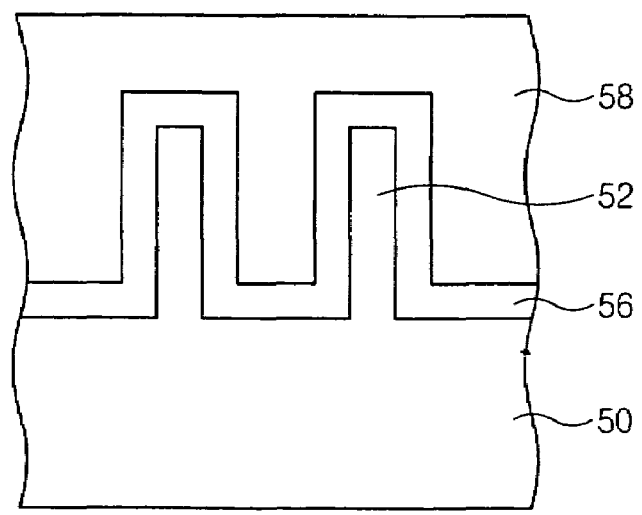

Referring to FIGS. 8A and 8B, after the first and second regions of the fins 52, a liner layer 56 is conformally formed on the surface of the substrate and the fins 52. The liner layer 56 may include a material having an etch selectivity with respect to the fins 52. For example, the liner layer 56 may include silicon nitride. An insulation layer 58 is formed on the liner 56. The insulation layer 58 may include a material having an etch selectivity with respect to the liner 56 and the substrate, may have good gap-filling efficiency. For example, the insulating layer 58 may include PECVD, HDPCVD, and/or $P_3$-TEOS.

Figure 9A:
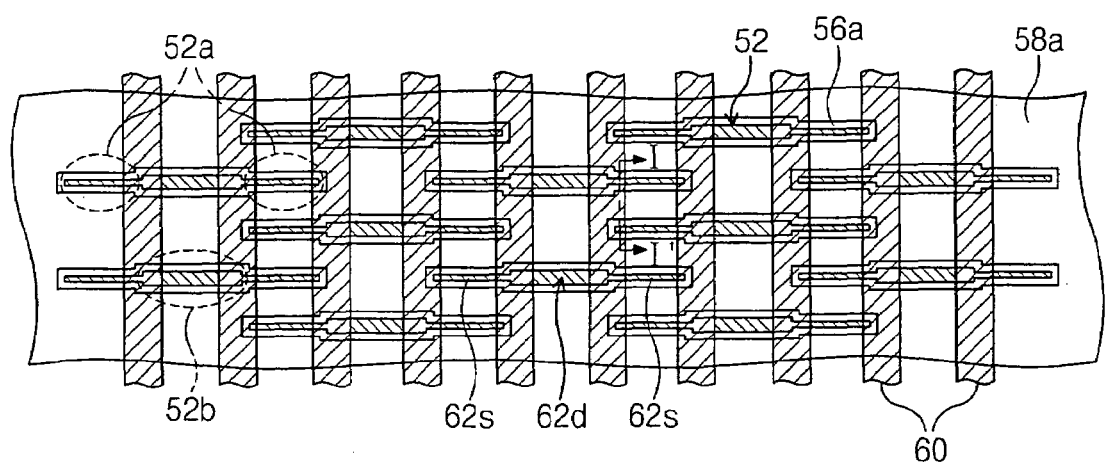
Figure 9B:
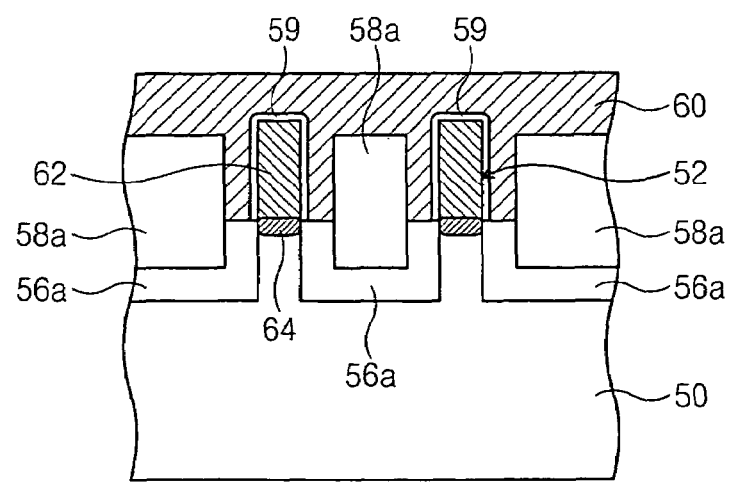

Referring to FIGS. 9A and 9B, the insulation layer 58 is recessed to expose the liner layer 56. The exposed liner layer 56 is recessed to expose at least a portion of the sidewalls of the fins 52. A device isolation layer, which includes the recessed insulation layer 58 and the liner layer 56, is formed on a region between the fins 52 to isolate the respective fins 52. Impurities can be implanted into the fins 52 to form a channel diffusion layer. The implantation of the impurities may be carried out using oblique ion implantation. The channel diffusion layer may be formed by implanting boron or boron fluoride at a dose of $10^{11}$ atoms/cm$^2$ to about $10^{14}$ atoms/cm$^2$ and at a concentration of $10^{15}$ atoms/cm$^3$ to about $10^{19}$ atoms/cm$^3$. Impurities may be further implanted vertically into a bottom of an exposed portion of the fins 52 according to a projection range (Rp). As a result, the impurities diffused from the channel diffusion layer may overlap the vertically implanted impurities to form an anti-punch-through diffusion layer of a high concentration. The anti-punch-through diffusion layer inhibits punch-through from occurring through a bottom of a channel diffusion layer which is not readily controlled by a gate.

The channel diffusion layer and the anti-punch-through diffusion layer may be formed after formation of the fins shown in FIG. 5, or in the step of FIG. 7D in which a sidewall of the fins is partially recessed and a device isolation layer is formed. When the fins 52 are formed on a SOI substrate, formation of an anti-punchthrough diffusion layer is not needed because an underlying insulation layer can prevent punch-through.

Referring to FIGS. 9A and 9B, a gate insulation layer 59 is formed on the exposed sidewall of the fin 52. The gate insulation layer 59 may be made from metal oxide, silicon oxide and/or silicon oxynitride, and may be formed by thermal oxidation or chemical vapor deposition (CVD). A conductive layer is formed on the substrate and the gate insulation layer 59. The conductive layer is patterned to form a gate electrode 60 crossing over the fin 52. As illustrated, because a device isolation layer is disposed between the fins, a width of the gap area is smaller than that of the gap area shown in FIG. 7D. The conductive layer may have a planar top surface. The gate electrode 60 may be formed using a damascene process. More particularly, formation of the gate electrode 60 may include forming a mold layer to cover an entire surface, patterning the mold layer to form an opening exposing the fin 52, forming a gate insulation layer on a surface of the exposed fin 52, and filling the opening with a conductive layer to form the gate electrode 60.

The gate electrode 60 overlaps an upper portion of a boundary region of the first and second regions 52b of the fin 52. Using the gate electrode 60 as an ion implanting mask, impurities are implanted into the fin 52 to form a source region 62s and a drain region 62d.

Figure 10A:
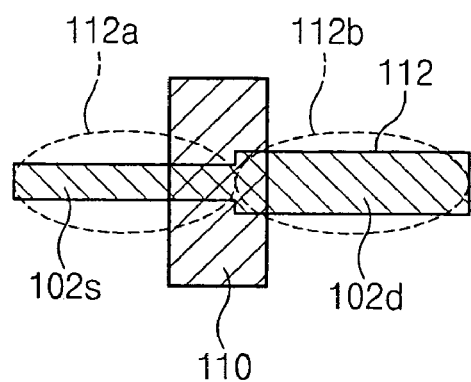
FIGS. 10A and 10B are top plan views of alternate embodiments of the FinFET of FIG. 2 in accordance with some other embodiments of the present invention.
Figure 10B:
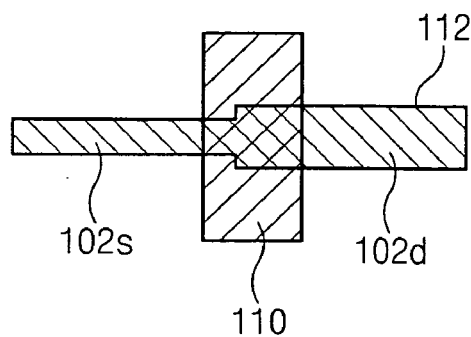

FIGS. 10A and 10B are top plan views of alternate embodiments of the FinFET of FIG. 2 in accordance with some other embodiments of the present invention.

Referring to FIGS. 10A and 10B, although a width of the gate electrode 110 is constant, the threshold voltage may be controlled by the overlap between the gate electrode 110 and the fin 112. When the gate electrode 110 overlaps more of the first region 112a than the second region 112b of the fin 112, the threshold voltage of the transistor decreases. In contrast, when the gate electrode 110 overlaps more of the second region 112b than the first region 112a, the threshold voltage of the transistor increases.

Figure 11:
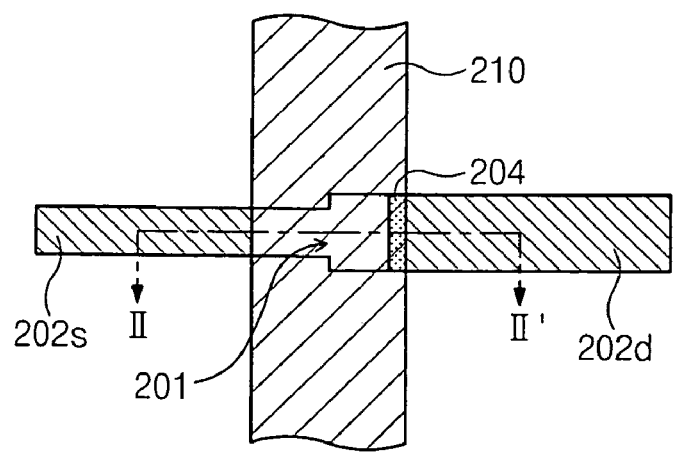
FIG. 11 is a top plan view of a FinFET according to a second embodiment of the present invention.

FIG. 11 is a top plan view of a FinFET according to a second embodiment of the present invention. Similar to the first embodiment of FIG. 2, the FinFET illustrated in FIG. 11 has a vertically extending fin 202. The fin 202 includes a first region having a first fin width and a second region having a second fin width which is larger than the first fin width. A gate electrode 210 crosses over and covers a portion of the fin 202. A gate insulation layer 208 is between the gate electrode 210 and the fin 202. A source region 202s and a drain region 202d are formed in the fin 202 and adjacent to opposite sides of the gate electrode 210. The source region 202s is formed in a first region having a relatively smaller width, and the drain region 202d is formed in a second region having a relatively larger width. A channel region 201 of the transistor is defined in a portion of the fin 202 that is covered by the gate electrode 210, and is between the source region 202s and the drain region 202d. Therefore, the channel region 201 is also disposed through the first and second regions. An impurity diffusion layer 204 of a higher doping concentration than the other channel regions 201 is formed in a channel region adjacent to the drain region 202d. A conduction type of the impurity diffusion layer 204 is different from that of the source region 202s and the drain region 202d.

Figure 12A:
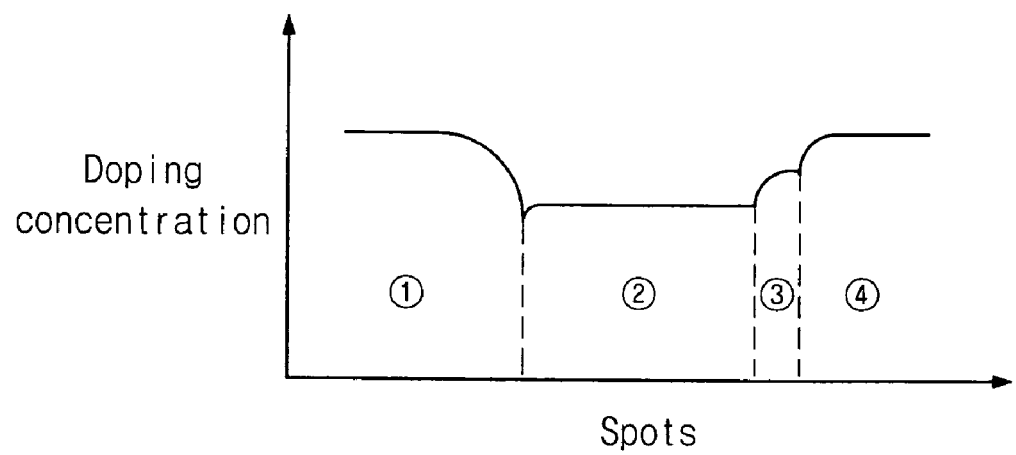
FIGS. 12A and 12B are graphs that illustrate doping concentrations and an energy band that vary along a line II-II' in FIG. 11.
Figure 12B:
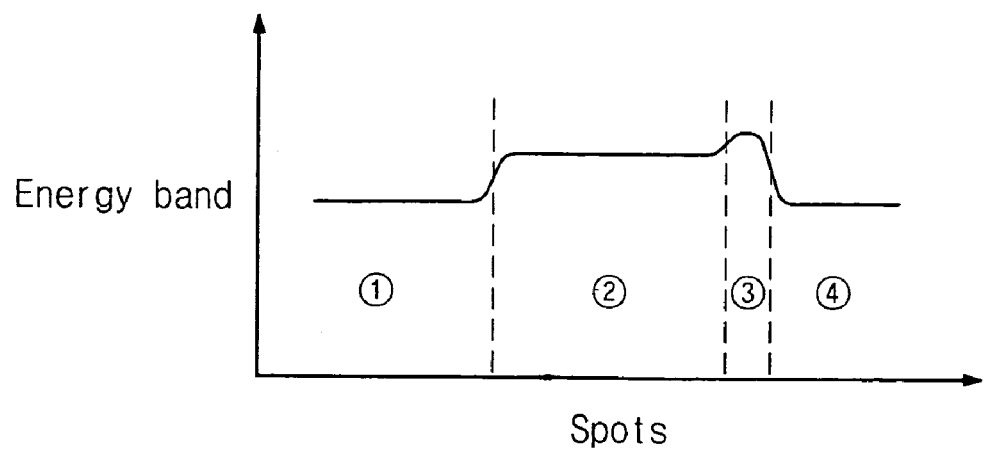

FIGS. 12A and 12B are graphs that illustrate doping concentrations and an energy band that vary along a line II-II' in FIG. 11. In these figures, a region (1) denotes a source region, a region (2) denotes a channel region, a region (3) is a channel region adjacent to a drain region, and a region (4) denotes a drain region.

A doping concentration of the source region (1) and the drain region (4) is higher than a doping concentration of the channel region (2), such as illustrated in these figures. When the FinFET is used in a DRAM cell transistor, the channel region (2) may have a typical p-type well concentration or p-type substrate concentration. P-type impurities such as boron or boron fluoride are additionally implanted into the p-type well or p-type substrate to more heavily dope the channel region (3) adjacent to the drain region. The source region (1) and the drain region (4) are doped with n-type impurities such as phosphorus (P) or arsenic (As).

As illustrated in FIG. 12B, an impurity concentration of the channel region (3) adjacent to the drain region is higher than that of the channel region (2) adjacent to the source region. For this reason, a potential barrier $\Phi_d$ is formed between a channel region and a drain region to offer a very advantageous characteristic to the FinFET according to the present invention.

Figure 13A:
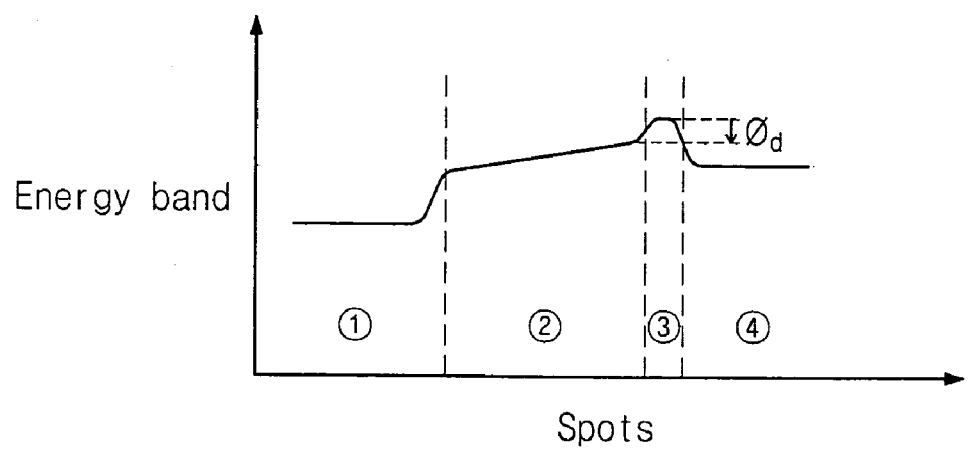
FIGS. 13A and 13B are graphs that illustrate energy band shapes during operation of the FinFET of FIG. 11 in accordance with some other embodiments of the present invention.
Figure 13B:
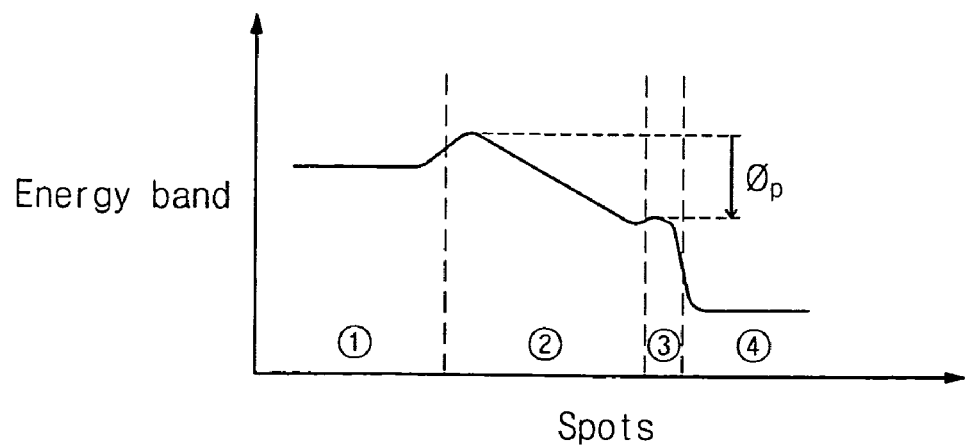

FIG. 13A and FIG. 13B are graphs that illustrate energy band shapes during operation of the FinFET of FIG. 11 in accordance with some other embodiments of the present invention.

FIG. 13A illustrates the state that charges are stored in a storage capacitor of a memory cell in which the storage capacitor is connected to the source region 202s and a bitline is connected to the drain region 202d. The impurity diffusion layer 204 produces a potential barrier $\Phi_d$ in a channel region (3) adjacent to the drain region 202d. Thus, while the transistor is turned off, the potential barrier $\Phi_d$ prevents electrons from flowing from the drain region (4) to reduce a transistor off leakage.

FIG. 13B illustrates a turn-on state of a transistor in which Vcc is applied to the drain region 202d through the bitline of a memory cell. Since the potential barrier $\Phi_d$ is disposed around a drain region of a high voltage level while a transistor is turned on, a peak of $\Phi_d$ is at a level which is $\Phi_d$ lower than a channel of the source side. Accordingly, there is a rare influence on the flow of electrons from the source region (1) to the drain region (4). Thus, the transistor has a low threshold voltage depending on a channel region (2) adjacent to the source region.

As previously explained, the FinFET according to the second embodiment of the present invention may have a high threshold voltage while being turned off, so that the off leakage is low. The FinFET may also have a low threshold voltage while being turned on, so that a transistor on current is low. Because a doping concentration of the channel region that is adjacent to the source region is low, a junction leakage between a source region and a channel may be suppressed.

Figure 14A:
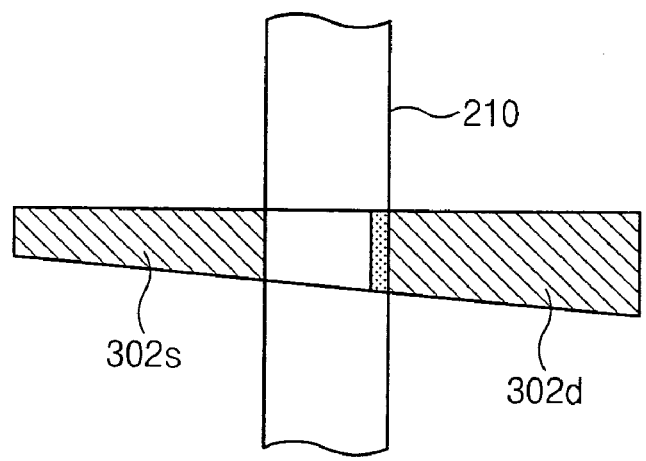
FIGS. 14A and 14B are top plan views of alternate embodiments of the FinFET of FIG. 11 in accordance with some other embodiments of the present invention.
Figure 14B:
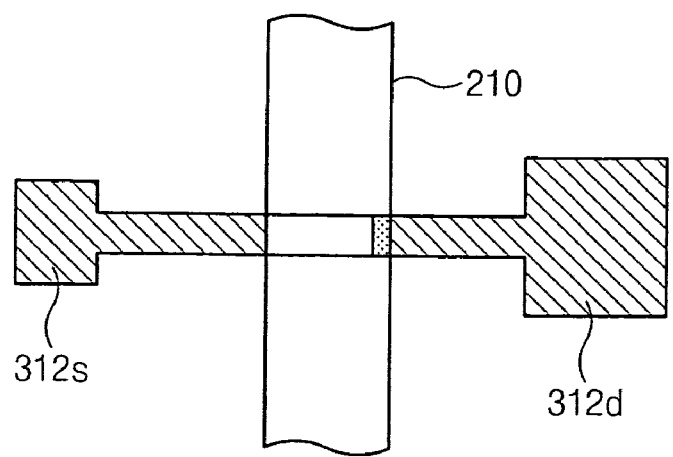

As shown in FIG. 11, the boundary region of the first region and the second region is covered by the gate electrode 210. In accordance with some embodiments of the present invention, the FinFET may include a fin that tapers off from a drain region 302d to a source region 302s (see FIG. 14A), or it may have a fin that has a larger width as it extends toward the drain region 312d than as it extends toward the source region 212s (e.g., FIG. 14B).

Figure 15:
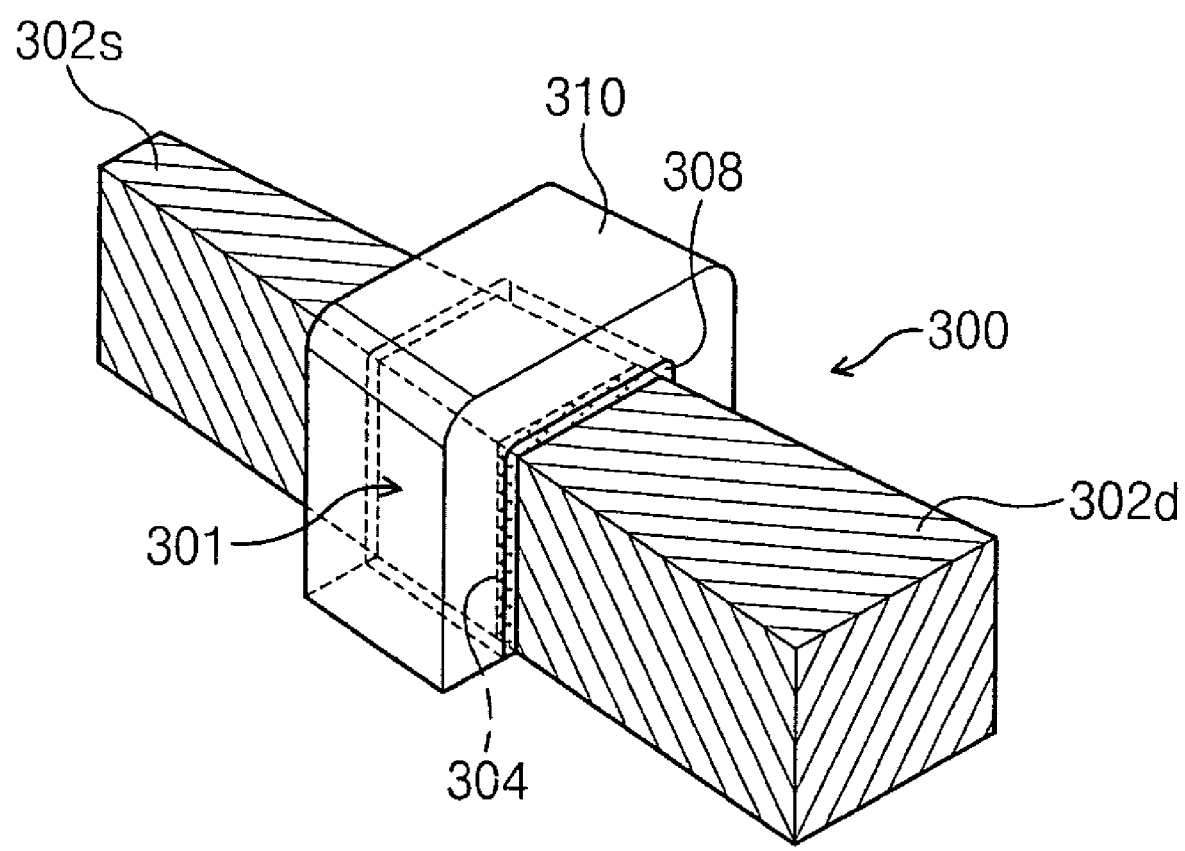
FIG. 15 is a perspective view of an alternate embodiment of the FinFET of FIG. 11 in accordance with some other embodiments of the present invention.

FIG. 15 is a perspective view of an alternate embodiment of the FinFET of FIG. 11 in accordance with some other embodiments of the present invention. Referring to FIG. 15, a fin 300 tapers down from a drain region 302d to a source region 302s. Accordingly, in contrast to the fin 200 of FIG. 11 that has an abrupt change in width, with an associated T-shape sides, in the channel region 201, the fin 300 shown in FIG. 15 does not have an abrupt change in width in a channel region 301.

As illustrated in this figure, the fin 300 is on and extends away from a substrate. A gate electrode 310 crosses over the fin 300 and is on sidewalls and a top surface of a portion of the fin 300. A gate insulation layer 308 is between the gate electrode 310 and the fin 300. The source region 302s and the drain region 302d are formed in the fin 300 and are adjacent to opposite sides of the gate electrode 310. The fin 300 becomes increasingly wider from the source region 302s to the drain region 302d. Because the cross-sectional area of the fin 300 in the source region 302s is small, the junction leakage is decreased. Because the area of the fin 300 in the drain region 302d increases, the transistor on current increases.

The channel region 301 is defined in the fin 300 in a portion that is covered by the gate electrode 310 and between the source region 302s and the drain region 302d. An impurity concentration of a portion of the channel region 301 that is adjacent to the drain region 302d is higher than a portion of the channel region 301 that is adjacent to the source region 302s. Accordingly, the impurity concentration of the channel region 301 can be lowered to increase the on current of the transistor, while a high-concentration diffusion layer 304 that is adjacent to the drain region 302d can inhibit electrons from flowing from the drain region 302d to the source region 302s. Consequently, the channel region 301 may be maintained at the initial impurity concentration of the substrate without forming a channel diffusion layer.

FIG. 16A through FIG. 16D are diagrams that illustrate methods of fabricating the FinFET of FIG. 15 in accordance with some embodiments of the present invention.

Figure 16A:
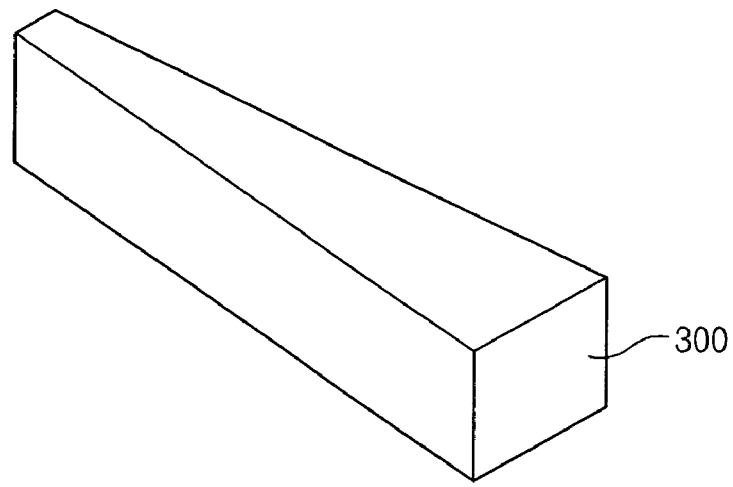
FIGS. 16A through 16D are diagrams that illustrate methods of fabricating the FinFET of FIG. 15 in accordance with some embodiments of the present invention.
Figure 16B:
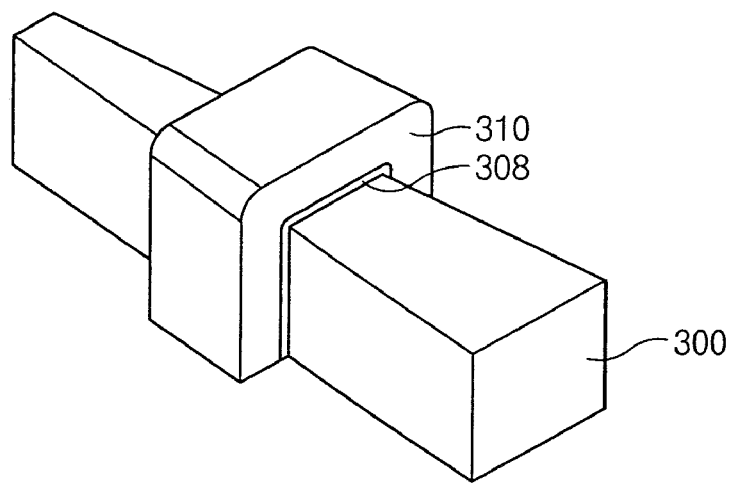

Referring to FIG. 16A, a vertically extending fin 300 is formed on a semiconductor substrate. As was described above, the fin 300 may be defined using a device isolation layer and etching a semiconductor bulk substrate, and/or it may be formed on a buried oxide layer and isolated by patterning a silicon layer of a SOI substrate. The fin 300 can taper off in width from one end to another, such as shown in FIG. 15, or it may have an abrupt change in width, such as shown in FIG. 11. Alternatively, the fin 300 may have an asymmetry taper shape (see FIG. 14A) or it may have a central region that is narrower than end portions of the fin 300 (see FIG. 14B).

Figure 16C:
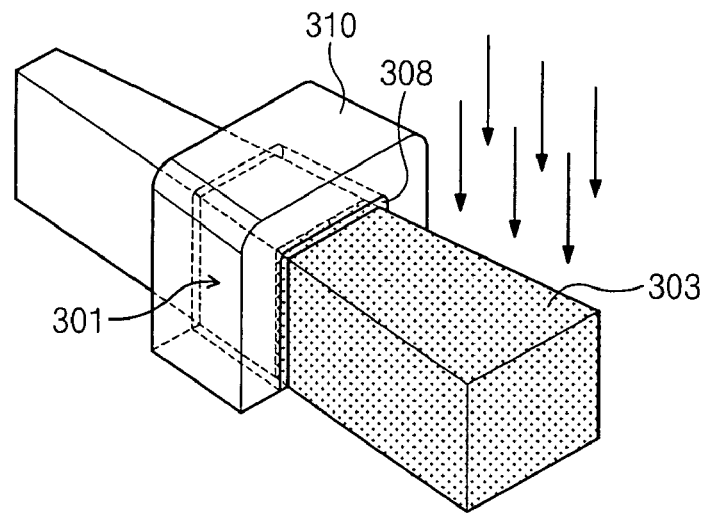
Figure 16D:
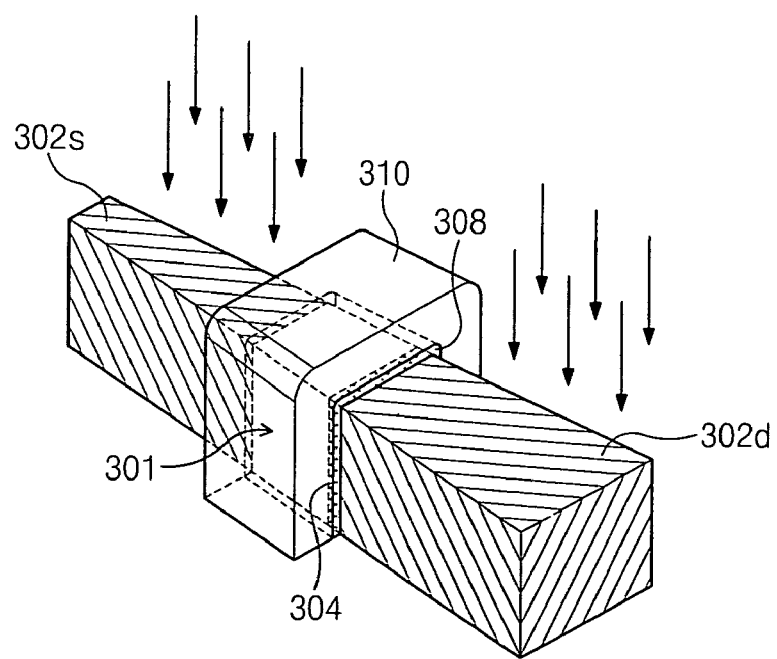

Referring to FIG. 16D, a gate insulation layer 308 is formed on the fin 300. A gate electrode 310 is formed on the fin and covering sidewalls and a top surface of a portion of the fin 300. A thick insulation layer may be formed on the top surface of the fin 300 between the gate electrode 310 and the top surface of the fin 300. When the gate electrode 310 is on sidewalls and a top surface of the fin 300, a channel may be formed through three faces of the fin 300. When a thick insulation layer is between the gate electrode 310 and a top surface of the fin 300, a channel may be formed in a portion of the fin 300 that is under the gate electrode 310.

Referring to FIG. 16C, impurities of a first conduction type are implanted into the fin 300 using the gate electrode 310 as a mask, and forming a diffusion layer 303 of the first conduction type. The impurities of the first conduction type are implanted into a wider portion of a fin 300, i.e., a portion where a drain of the transistor is to be formed (which will be used as a bitline-connected area in a DRAM cell array). The impurities of the first conduction type have the same conduction type as initial impurities of the fin 300. For example, in a DRAM device that uses NMOS transistors and a p-type substrate or a p-type well, the impurities of the first conduction type may be p-type impurities such as boron or boron fluoride. The diffusion layer 303 of the first conduction type may be laterally diffused to a lower portion of the gate electrode 310.

Referring to FIG. 16D, using the gate electrode 310 as an ion implanting mask, impurities of a second conduction type are implanted into the fin 300 to form a source region 302s and a drain region 302d in the fin 300 on opposite sides of the gate electrode 310. The source region 302s is in a narrow portion of the fin 300, and the drain region 302d is in a wider portion of the fin 300. The impurities of the second conduction type may be phosphorus or arsenic. The impurities of the second conduction type form the drain region 302d by inverting the first conduction type of the diffusion layer 303. The lateral diffusion distance of the first conduction type impurities can be longer than that of the second conduction type impurities. The diffusion layer 304 of the first conduction type may be in the fin 300 adjacent to the drain region 302d. The channel region 301 is defined by the source region 302s and the drain region 302d. A portion of the fin 300 that is adjacent to the drain region 302d has a higher impurity concentration than the portion of the fin 300 that is adjacent to the source region 302s. The operations for forming the first conduction type diffusion layer and the second conduction type diffusion layer can be interchanged. The first conduction type diffusion layer can be subjected to more thermal oxidation than the second conduction type diffusion layer to control the associated diffusion distances.

As was explained with reference to FIGS. 9A and 9B, when a plurality of the fins 300 are used in FinFETs in a DRAM device, a device isolation layer can be used to isolate the fins 300. An impurity-implanting dose of the second embodiment can be lower than that of the first embodiment, and a channel diffusion layer may, or may not, be used as was previously explained. An anti-punch-through diffusion layer may be formed on a lower portion of the fin 300. A pair of gate electrodes may be formed on, and crossing over, the fin 300. Impurities of a first conduction type can be implanted into the fin 300 between gate electrodes to form a diffusion layer of the first conduction type. Using the gate electrodes as an ion implanting mask, impurities are implanted into the fin 300 to form a common drain region 302d in the fin 300 between the gate electrodes 310 and to form a source region 302s in the fin 300 on opposite sides adjacent to the common drain region 302d. A bitline can be connected to the common drain region 302d and a storage capacitor can be connected to the source region 302s.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. A method for fabricating a fin field effect transistor (FinFET), the method comprising:
    providing a substrate;
    forming a fin on the substrate and extending laterally along and vertically away from the substrate, wherein a first region of the fin has a first fin width and a second region of the fin has a second fin width, wherein the second fin width is larger than the first fin width;
    forming a gate insulation layer on a portion of the fin; and
    forming a gate electrode on the gate insulating layer and covering sides and a top of a portion of the fin, wherein one side of the gate electrode covering the first region of the fin has a first fin width and the other side of the gate electrode covering the second region of the fin has a different second fin width.

2. The method of claim 1, wherein forming a fin comprises:
    patterning the substrate to form the fin therefrom, wherein the formed fin has the second fin width;
    forming a mask pattern on the fin;
    oxidizing a sidewall of the fin to form a sacrificial oxide layer while using the mask pattern as an oxidation barrier layer;
    removing the sacrificial oxide layer to form the first region of the fin having the first fin width; and
    removing the mask pattern to expose the second region of the fin having the second fin width.

3. The method of claim 2, wherein providing a substrate comprises:
    providing a support substrate;
    forming a buried insulating layer on the support substrate;
    forming a semiconductor layer on the buried insulating layer, and wherein patterning the substrate to form the fin therefrom comprises patterning the semiconductor layer to form the fin therefrom.

4. The method of claim 1, wherein:
    providing a substrate comprises providing a semiconductor substrate; and
    forming a fin on the substrate comprises patterning the semiconductor substrate to form the fin therefrom, and further comprising forming a device isolation layer on the semiconductor substrate and the fin.

5. The method of claim 4, wherein forming a device isolation layer comprises:
    forming a liner layer on the semiconductor substrate and the fin;
    forming an insulation layer on the liner layer;
    recessing a portion of the insulation layer to expose the liner layer; and
    recessing the liner layer to partially expose sidewalls of the fin.

6. A method for fabricating a fin field effect transistor (FinFET), the method comprising:
    providing a substrate;
    forming a fin on the substrate and extending laterally along and vertically away from the substrate, wherein a first region of the fin has a first fin width and a second region of the fin has a second fin width, wherein the second fin width is larger than the first fin width;
    forming a gate insulation layer on a portion of the fin;
    forming a gate electrode on the gate insulating layer and covering sides and a top of a portion of the fin, wherein one side of the gate electrode covering the first region of the fin has a first fin width and the other side of the gate electrode covering the second region of the fin has a different second fin width;
    implanting impurities of a first conduction type into the fin on one side of the gate electrode; and
    implanting impurities of a second conduction type into the fin, using the gate electrode as an ion implanting mask, to form a source region in the first region, to form a drain region in the second region, and to form a first diffusion layer in a channel region adjacent to the drain region, wherein the source and drain regions define the channel region.

7. The method of claim 6, wherein;
    implanting impurities of a second conduction type into the fin comprises implanting the second conduction type impurities with a shorter lateral diffusion distance than a lateral diffusion distance of the first conduction-type impurities.

8. The method of claim 1, wherein a portion of the fin under the gate electrode is formed to have an abrupt change in width.

9. The method of claim 8, wherein the portion of the fin under the gate electrode having an abrupt change in width is formed with a T-shape.

10. The method of claim 1, wherein the fin tapers off from the first region to the second region of the fin.

11. A method for fabricating a fin field effect transistor (FinFET), the method comprising:
    providing a substrate;
    forming a fin on the substrate and extending laterally along and vertically away from the substrate, wherein a first region of the fin has a first fin width and a second region of the fin has a second fin width, wherein the second fin width is larger than the first fin width;
    forming a gate insulation layer on a portion of the fin;
    forming a gate electrode on the gate insulating layer and covering sides and a top of a portion of the fin, wherein the fin is formed to have an abrupt change in width, and the gate electrode is formed to cover a portion of the fin having the abrupt change in width.

12. The method of claim 11, wherein the fin is formed to have a T-shape where it abruptly changes in width.

13. A method for fabricating a fin field effect transistor (FinFET), the method comprising:
    providing a substrate;

forming a fin on the substrate and extending laterally along and vertically away from the substrate, wherein a first region of the fin has a first fin width and a second region of the fin has a second fin width, wherein the second fin width is larger than the first fin width;

forming a gate insulation layer on a portion of the fin;

forming a gate electrode on the gate insulating layer and covering sides and a top of a portion of the fin, wherein the fin is formed to taper off from the first region to the second region, and the gate electrode is formed to cover a portion of the fin that tapers off from the first region to the second region.

14. A method for fabricating a fin field effect transistor (FinFET), the method comprising:

providing a substrate;

forming a fin on the substrate and extending laterally along and vertically away from the substrate, wherein a first region of the fin has a first fin width and a second region of the fin has a second fin width, wherein the second fin width is larger than the first fin width;

forming a gate insulation layer on a portion of the fin;

forming a gate electrode on the gate insulating layer and covering sides and a top of a portion of the fin;

implanting impurities of a first conduction type into the fin on one side of the gate electrode; and implanting impurities of the second conduction type into the fin, using the gate electrode as an ion implanting mask, to form a source region in the first region, to form a drain region in the second region, and to form a first diffusion layer in a channel region adjacent to the drain region, wherein the source and drain regions define the channel region, and wherein the fin is formed to have an abrupt change in width, and the gate electrode is formed to cover a portion of the fin having the abrupt change in width.

15. The method of claim 14, wherein the fin is formed to have a T-shape where it abruptly changes in width.

16. A method for fabricating a fin field effect transistor (FinFET), the method comprising:

providing a substrate;

forming a fin on the substrate and extending laterally along and vertically away from the substrate, wherein a first region of the fin has a first fin width and a second region of the fin has a second fin width, wherein the second fin width is larger than the first fin width;

forming a gate insulation layer on a portion of the fin;

forming a gate electrode on the gate insulating layer and covering sides and a top of a portion of the fin;

implanting impurities of a first conduction type into the fin on one side of the gate electrode; and implanting impurities of the second conduction type into the fin, using the gate electrode as an ion implanting mask, to form a source region in the first region, to form a drain region in the second region, and to form a first diffusion layer in a channel region adjacent to the drain region, wherein the source and drain regions define the channel region, and wherein the fin is formed to taper off from the first region to the second region, and the gate electrode is formed to cover a portion of the fin that tapers off from the first region to the second region.

* * * * *

UNITED STATES PATENT AND TRADEMARK OFFICE
CERTIFICATE OF CORRECTION

PATENT NO. : 7,332,386 B2  Page 1 of 1
APPLICATION NO. : 11/084922
DATED : February 19, 2008
INVENTOR(S) : Lee et al.

It is certified that error appears in the above-identified patent and that said Letters Patent is hereby corrected as shown below:

Item 54 on Title Page, and Column 1, lines 1-2: Please correct title to read:
--Methods of Fabricating Fin Field Effect Transistors--

Signed and Sealed this

Tenth Day of June, 2008

JON W. DUDAS
*Director of the United States Patent and Trademark Office*